(12) United States Patent
Kobayakawa et al.

(10) Patent No.: US 7,436,045 B2
(45) Date of Patent: Oct. 14, 2008

(54) GALLIUM NITRIDE-BASED SEMICONDUCTOR DEVICE

(75) Inventors: Masato Kobayakawa, Ichihara (JP); Hideki Tomozawa, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/591,584

(22) PCT Filed: Mar. 3, 2005

(86) PCT No.: PCT/JP2005/004138

§ 371 (c)(1),
(2), (4) Date: Nov. 27, 2006

(87) PCT Pub. No.: WO2005/086241

PCT Pub. Date: Sep. 15, 2005

(65) Prior Publication Data

US 2007/0152232 A1    Jul. 5, 2007

Related U.S. Application Data

(60) Provisional application No. 60/553,429, filed on Mar. 16, 2004.

(30) Foreign Application Priority Data

Mar. 4, 2004 (JP) .............................. 2004-060585

(51) Int. Cl.
*H01L 29/20* (2006.01)
(52) U.S. Cl. ................ 257/615; 257/613; 257/745; 257/E31.019; 257/E27.012
(58) Field of Classification Search ............. 215/613, 215/615, 745, E33.023, E33.049, E31.019, 215/E27.012
See application file for complete search history.

(56) References Cited

U.S. PATENT DOCUMENTS 3,762,945 A * 10/1973 DiLorenzo ............. 438/571
6,297,442 B1 * 10/2001 Yagi et al. ............. 136/256

FOREIGN PATENT DOCUMENTS

| CA | 1095154 | 2/1981 |
|---|---|---|
| JP | 53-20882 | 2/1978 |
| JP | 54-71590 | 6/1979 |
| JP | 55-3834 | 1/1980 |

(Continued)

OTHER PUBLICATIONS

Iwao Teramoto; "Outline of Semiconductor Device"; Baifukan Co., Ltd. (publisher); Mar. 30, 1995; pp. 113-115.

*Primary Examiner*—A. Sefer
*Assistant Examiner*—Scott R Wilson
(74) *Attorney, Agent, or Firm*—Sughrue Mion, PLLC (57) ABSTRACT

A gallium nitride-based semiconductor device has a p-type layer that is a gallium nitride (GaN) compound semiconductor layer containing a p-type impurity and exhibiting p-type conduction. The p-type layer includes a top portion and an inner portion located under the top portion. The inner portion contains the p-type impurity and, in combination therewith, hydrogen. The top portion includes a region containing a Group III element and a Group V element at a non-stoichiometric atomic ratio.

7 Claims, 2 Drawing Sheets

FOREIGN PATENT DOCUMENTS

| | | |
|---|---|---|
| JP | 6-237012 | 8/1994 |
| JP | 8-116089 A | 5/1996 |
| JP | 9-266218 A | 10/1997 |
| JP | 11-150296 A | 6/1999 |
| JP | 11-177133 A | 7/1999 |
| JP | 11-204887 A | 7/1999 |
| JP | 2000-101139 A | 4/2000 |
| JP | 2002-203798 A | 7/2002 |
| JP | 2002-324913 A | 11/2002 |
| JP | 2003-243302 | 8/2003 |
| JP | 2004-14810 A | 1/2004 |

* cited by examiner

GALLIUM NITRIDE-BASED SEMICONDUCTOR DEVICE

CROSS REFERENCE TO RELATED APPLICATIONS

This application is an application filed under 35 U.S.C. §111(a) claiming the benefit pursuant to 35 U.S.C. §119(e)(1) of the filing date of Provisional Application No. 60/553,429 filed Mar. 16, 2004 pursuant to 35 U.S.C. §111(b).

TECHNICAL FIELD

The present invention relates to a gallium nitride-based semiconductor device having a p-type gallium nitride semiconductor layer, such as a light-emitting diode (LED), a laser diode (LD) or a pin-type photodetector.

BACKGROUND ART

Conventionally, gallium nitride (GaN)-based semiconductor materials represented by a compositional formula, such as $Al_XGa_YIn_ZN$ ($0 \leq X, Y, Z \leq 1$; $X+Y+Z=1$), and having a direct-transition-type bandgap of energy corresponding to a wavelength region of short-wavelength visible light to the UV region have been employed for fabricating pn-junction light-emitting devices, such as blue, green or UV LEDs and LDs (see, for example, JP-B SHO 55-3834).

Conventionally, p-conduction-type GaN for fabricating a pn-junction gallium nitride semiconductor light-emitting device is formed so that GaN contains an additive. For example, there has been disclosed a technique in which a Group II impurity, such as magnesium (Mg) or zinc (Zn), is added to a GaN layer through ion injection means (see, for example, JP-A SHO 54-71590).

However, without any further treatment, the gallium nitride-based semiconductor layer to which a Group II impurity has been added generally does not serve as a p-type conductive layer exhibiting high conductivity. One conceivable reason for this is that hydrogen (H) migrating from a growth atmosphere to the layer during vapor phase growth electrically compensates the Group II impurity, thereby deactivating the impurity. Thus, according to a conventional procedure, a gallium nitride-based semiconductor layer is formed through addition of a Group II impurity to the layer, followed by heating the layer in order to remove, as much as possible, hydrogen contained in the layer (see, for example, JP-A HEI 6-237012). Another known technical approach is irradiation with charged particles for electrically activating a Group II impurity (see, for example, JP-A SHO 53-20882).

Even when virtually the entire amount of hydrogen is removed from the GaN-based semiconductor layer to which a p-type Group II impurity has been added, the thus obtained low-resistance p-type conductor layer does not necessarily attain excellent, reliable rectifying characteristics and electrostatic blocking voltage characteristics when a pn-junction LED is fabricated therefrom. Among these characteristics, currently, consistent electrostatic blocking voltage is difficult to attain, even when the p-type GaN-based semiconductor layer is formed on a conductive substrate, such as a silicon (Si) single-crystal substrate, silicon carbide (SiC) or gallium arsenide (GaAs).

One conceivable means for preventing local breakdown is inserting, into a semiconductor structure, a layer exhibiting wide bandgap and high resistance. However, this means has a drawback. That is, even when such a high-resistance layer is employed as, for example, a contact layer for forming an ohmic electrode and an ohmic electrode is provided on the contact layer to thereby fabricate a GaN-based semiconductor LED or LD, forward voltage (Vf) or threshold voltage (Vth) undesirably increases.

An object of the present invention is to prevent variation of electrostatic blocking voltage and increase in, for example, forward voltage of a gallium nitride semiconductor device, such as an LED, fabricated from the aforementioned conventional p-type GaN-based semiconductor layer. Particularly, the present invention provides a GaN-based semiconductor device exhibiting improved electrostatic blocking voltage, low forward voltage, etc., through causing to remain hydrogen contained in a Group-II-impurity-added GaN-based semiconductor layer in a specific region in the layer, rather than intentionally removing hydrogen to the outside of the layer, and through provision of a low-resistance region (low-resistance layer) in a layer (top portion) located on the specific region.

DISCLOSURE OF THE INVENTION

The present invention has been accomplished in order to solve the aforementioned problems and provides a gallium nitride-based semiconductor device having a p-type layer that is a gallium nitride (GaN) compound semiconductor layer containing a p-type impurity and exhibitomg p-type conduction, wherein the p-type layer comprises a top portion and an inner portion located under the top portion, wherein the inner portion contains the p-type impurity and, in combination therewith, hydrogen and wherein the top portion includes a region containing a Group III element and a Group V element at a non-stoichiometric atomic ratio.

In the gallium nitride-based semiconductor device, the inner portion of the p-type layer has a percent thickness of 40% to 99.9% with respect to a thickness of the p-type layer.

In the first or second mentioned gallium nitride-based semiconductor device, the inner portion of the p-type layer has a hydrogen concentration of $1 \times 10^{18}$ cm$^{-3}$ or more and an impurity concentration of $1 \times 10^{18}$ cm$^{-3}$ to $1 \times 10^{21}$ cm$^{-3}$.

In any one of the first to third mentioned gallium nitride-based semiconductor devices, the inner portion has a hydrogen concentration that is equal to, or lower than, an impurity concentration.

In any one of the first to fourth mentioned gallium nitride-based semiconductor devices, the region containing a Group III element and a Group V element at a non-stoichiometric atomic ratio has a thickness of 1 to 10 nm from the top surface of the p-type layer in a depth direction.

In any one of the first to fifth mentioned gallium nitride-based semiconductor devices, the top portion of the p-type layer has a surface having Ga deposited thereon.

In any one of the first to sixth mentioned gallium nitride-based semiconductor devices, the p-type layer has a surface having joined thereto a gallium nitride semiconductor material containing a Group III element and a Group V element at a non-stoichiometric atomic ratio.

In the seventh mentioned gallium nitride-based semiconductor device, the gallium nitride semiconductor material is boron phosphide (BP) having a non-stoichiometric atomic ratio.

According to the present invention, a GaN-based semiconductor light-emitting device is fabricated from a p-type-impurity-element-added p-type GaN-based semiconductor layer having an inner potion including a high-resistance region in which hydrogen is caused to remain and a top portion that is located on the inner portion and includes a region having a non-stoichiometric composition. Therefore, a GaN semiconductor device (e.g., LED) exhibiting excellent electrostatic blocking voltage and low forward voltage can be produced.

BEST MODES FOR CARRYING OUT THE INVENTION

The gallium nitride-based semiconductor device of the present invention has a p-conduction-type gallium nitride (GaN)-based compound semiconductor layer (p-type layer), wherein the p-type layer comprises a top portion and an inner portion located under the top portion, wherein the inner portion contains a p-type impurity and hydrogen in an amount falling within a predetermined range and wherein the top portion includes a region containing a Group III element and a Group V element at a non-stoichiometric atomic ratio.

Other components of the semiconductor device may be fabricated from conventionally known device components without any modification. The substrate of the semiconductor device is preferably a crystalline substrate, desirably a single-crystal substrate. Examples of the substrate material include sapphire, cubic SiC and hexagonal SiC. Single crystals of gallium phosphide (GaP), GaAs, silicon, zinc oxide (ZnO) and GaN may also be employed. When the p-type layer is stacked on a lattice-mismatch crystalline substrate, a lattice-mismatch crystal epitaxial growth technique, which is called seeding process (SP) (JP-A 2003-243302), is advantageously employed.

No particular limitation is imposed on the sort of the p-type layer of the present invention, and a p-type GaN layer, such as a p-type GaN cladding layer or a p-type GaN contact layer, may be employed. At least one of the p-type GaN layers may constitute the p-type layer of the present invention.

The p-type layer may be grown through vapor phase growth means, such as molecular-beam epitaxy (MBE), metal-organic chemical vapor deposition (MOCVD) and hydride vapor phase epitaxy (HVPE). Regarding nitrogen sources for forming the GaN-based semiconductor layer, ammonia, hydrazine, an azide or a similar compound may be used. Examples of the Group III organometallic source which may be employed include trimethylgallium, triethylgallium, trimethylindium and trimethylaluminum.

Examples of the p-type impurity (dopant) to be added during vapor phase growth of the p-type layer include Group II elements, such as Mg, zinc (Zn), beryllium (Be), calcium (Ca), strontium (Sr), barium (Ba), cadmium (Cd) and mercury (Hg). Amphoteric impuritys belonging to Group IV (e.g., carbon (C)) may also be used (see, Iwao Teramoto, "Introduction of Semiconductor Device," Mar. 30, 1995, published by Baifukan, 1st edition, p. 113). Among them, a Group II element, such as Mg, is preferably used as a p-type impurity.

The p-type impurity (such as Mg) concentration is virtually uniform in the p-type layer (i.e., the top portion and the inner portion), and is about $5 \times 10^{18}$ cm$^{-3}$ to about $1 \times 10^{21}$ cm$^{-3}$. The top portion of the p-type layer contains only a small amount of hydrogen, but the inner portion contains hydrogen in an amount falling within a range that enables prevention of loss of the p-type conduction. Specifically, the amount is generally $1 \times 10^{18}$ or more, preferably $1 \times 10^{18}$ to $1 \times 10^{21}$. The range where the p-type conduction is not lost corresponds to, for example, a range of resistance of about 10 µΩ or less. The p-type impurity concentration and the hydrogen concentration of the p-type layer may be quantitatively determined through conventional analysis means, such as secondary ion mass spectrometry (SIMS) or Auger electron spectroscopy (AES).

The p-type layer including an inner portion generally has a total thickness of 0.5 µm or less, preferably 0.2 µm or less, more preferably 0.1 µm or less. The lower limit of the layer thickness is about 1 nm. The total thickness of the p-type layer may be controlled by modifying the time for feeding a Group III element source to the growth system during vapor phase growth. The total thickness of the p-type layer may be determined through observation under an optical microscope, a scanning electron microscope (SEM), a transmission electron microscope (TEM), etc. According to the present invention, hydrogen is intentionally caused to remain in the inner portion of the p-type layer having the aforementioned thickness in an amount falling within a specific range. The term "inner portion" is a portion located under the top surface of the p-type layer and corresponds to the contact layer 107-1 shown in FIG. 1.

When hydrogen is caused to remain so as to electrically inactivate the added p-type impurity, forward voltage (Vf) and threshold voltage (Vth) are considered to increase. However, actually, since the layer thickness is very small, these voltages are not virtually affected. The inner portion of the p-type layer preferably has a percent thickness of 40% to 99.9% with respect to the thickness of the p-type layer, more preferably 70% to 99.9% with respect to the thickness of the p-type layer. The interface between the inner portion and the top portion of the p-type layer is a sub-layer having ⅔ the maximum hydrogen concentration of the p-type layer, and is determined through SIMS.

According to the conventional heating means, hydrogen remaining in the p-type layer in the form of an electrically inactive complex with the p-type impurity is removed from the layer as much as possible. The technical means according to the present invention is completely different from the conventional heating means in that hydrogen is caused to remain in a specific amount in the inner portion.

In the present invention, a layer containing a p-type impurity is formed through addition of the p-type impurity to the layer, and the formed layer is subjected to thermal treatment in an atmosphere predominantly containing an inert gas, whereby a region in which a specific amount of hydrogen remains can be formed. The thermal treatment may be performed in a growth furnace where growth has been performed. In the case where the cooling starting temperature is equal to the temperature at which the layer containing the p-type impurity has been formed, the greater the cooling rate, the thinner the region in which hydrogen is caused to remain. At a given cooling rate, the higher the cooling starting temperature, the thinner the region in which hydrogen is intentionally caused to remain.

The layer containing a p-type impurity may be cooled also in a mixed gas atmosphere, for example, a mixture of hydrogen ($H_2$) with an inert gas, such as nitrogen ($N_2$), argon (Ar) or helium (He). Through increase in hydrogen content by volume of the atmosphere, the thickness of the region in which hydrogen is caused to remain can be increased. However, the hydrogen content by volume is preferably 40% or less. When the hydrogen content is excessively large, the amount of hydrogen captured in the layer containing a p-type impurity increases. In this case, the thickness of the region in which hydrogen is caused to remain is difficult to control favorably.

The thickness of the region in the p-type layer in which hydrogen is caused to remain in a specific amount varies depending on cooling starting temperature, cooling rate, composition of the atmosphere, form of a cooling apparatus, etc. Therefore, these conditions are not predetermined definitely. When an Mg-doped GaN layer is cooled from 1,050° C. that is the growth temperature thereof to room temperature in a mixed gas of 95 vol. %-nitrogen and 5 vol. %-hydrogen, the cooling rate is generally controlled to 40° C./min to 120° C./min so as to form the region according to the present invention in which hydrogen is caused to remain. In the case of an aluminum (Al)-containing layer (e.g., $Al_XGa_YN$ ($0 \leqq X$, $Y \leqq 1$, $X+Y=1$)), the cooling rate may be decreased.

Even when the cooling rate and the composition of the atmosphere gas in which cooling is performed are modified, distribution of the p-type impurity concentration in the p-type layer is not changed.

If hydrogen is completely caused to remain in the p-type layer, formation of a low-contact resistance ohmic electrode is affected. Therefore, when the p-type layer is employed, for example, as a contact layer for forming an ohmic electrode, the p-type layer is preferably formed of an inner portion containing a region in which hydrogen is caused to remain and the top portion exhibiting low resistance.

According to the present invention, in order to lower the resistance (forward voltage) of the top portion of the p-type layer, at least a portion of the top portion is formed of a layer containing a Group III element and a Group V element at a non-stoichiometric atomic ratio. The term "non-stoichiometric" refers to, in the case of GaN, a state where the atomic ratio of Ga to N is deviated from 1:1. Preferably, the low-resistance layer having a non-stoichiometric composition is provided from the top surface of the p-type layer to a depth of 1 to 10 nm. The non-stoichiometric composition is preferably rich in Group III element. More preferably, Ga is deposited on a portion (1% to 100%) of the surface or the entire surface of the p-type layer. In the present invention, deviation in compositional proportion of Ga to N includes the deviation in composition of the GaN compound and the deviation in composition of the entire top portion attributed to the aforementioned deposition of Ga. The low-resistance GaN layer is formed from a low-resistance p-type GaN layer having a gallium (Ga)-rich non-stoichiometric composition.

The p-type low-resistance layer having a non-stoichiometric composition may be formed in the top portion of the p-type layer through, for example, vapor phase growth means, such as MOCVD. For example, the low-resistance layer can be formed through vapor phase growth of a p-type GaN semiconductor layer containing a p-type impurity while the so-called V/III ratio is changed. For example, the p-type low-resistance layer is formed at a decreasing V/III ratio. Specifically, a p-type low-resistance layer is formed under such conditions that the feed of Group III element to the growth reaction system is increased while the constant feed of Group V element maintained. Alternatively, a p-type low-resistance layer is formed under such conditions that the feed of Group V element to the growth reaction system is decreased while the constant feed of Group III element maintained.

In the semiconductor device of the present invention, a layer, for example, p-type GaN semiconductor layer, having non-stoichiometric composition may be further provided on the surface of the p-type layer. An exemplary method includes modifying the composition of a target material or a vapor deposition source so as to be deviated from the stoichiometry in advance and subjecting the material or source to conventional high-frequency sputtering or vapor deposition, thereby joining a non-stoichiometric semiconductor layer to the surface. Alternatively, a p-type GaN semiconductor layer having a non-stoichiometric composition may be grown on the surface of the p-type layer by supplying Ga in an amount greater than that of nitrogen through MBE means or similar means. In the p-type layer or on the surface of the p-type layer, the deviation from the stoichiometry of the semiconductor (i.e., Group III element and Group V element) is very small.

The material having a non-stoichiometric composition to be joined to the surface of the p-type layer is not necessarily formed of the same GaN semiconductor material as employed for forming the p-type layer. For example, p-type boron phosphide (BP) compound semiconductor layer having a non-stoichiometric composition may be joined to the surface of p-type $Al_XGa_YN$ ($0 \leqq X$, $Y \leqq 1$, $X+Y=1$) including a high-resistance region in which hydrogen is caused to remain. Other than these semiconductor compounds, GaN, AlGaN or similar compounds may be used. Among them, boron monophosphide (BP) that is rich in boron (B) (Group III element) with respect to phosphorus (P) is particularly preferred, since a p-type low-resistance conductor layer can be readily formed in an undoped state. The layer of BP or a similar material preferably has a thickness of 0.01 μm to 1 μm.

The aforementioned method for forming a p-type GaN smiconductor layer having a non-stoichiometric composition on the surface of the p-type layer may also be employed for forming the top portion of the BP layer.

The low-resistance region formed from the top portion having a non-stoichiometric composition or the low-resistance layer having a non-stoichiometric composition and joined to the surafce of the p-type layer is advantageous for forming a low-contact-resistance p-type ohmic electrode thereon. Thus, the non-stoichiometric region or layer is effective for producing LEDs exhibiting low forward voltage. This effect has no restrictions on the kind of metal and is predominantly manifested with respect to all metals known to the art.

Hydrogen which is caused to remain in the GaN semiconductor layer containing a p-type impurity can provide a high-resistance region in the layer, thereby enhancing electrostatic blocking voltage characteristics.

The method for fabricating the p-type Group III semiconductor according to the present invention is applicable to the fabrication of any kind of semiconductor device including various kinds of high-speed transistors and photodetectors, besides semiconductor light-emitting devices including light-emitting diodes and laser diodes, requiring a p-type Group III nitride semiconductor. Of these semiconductor devices, the method of the present invention can advantageously be used for the fabrication of semiconductor light-emitting devices requiring formation of a pn junction and formation of a positive electrode having good characteristics.

On example of the structure of the Group III nitride semiconductor light-emitting device fabricated in accordance with the method of the present invention will be described. On a substrate an n-type Group III nitride semiconductor layer, a light-emitting layer and a p-type semiconductor layer are sequentially deposited via a buffer layer, if necessary, and a negative electrode and a positive electrode are provided respectively on the n-type semiconductor layer and the p-type semiconductor layer. Here, the p-type semiconductor layer constituting the uppermost layer has the structure described in connection with the present invention.

Sapphire, SiC, GaN, AlN, Si, ZnO or other oxides, and other materials known to the art can be used without any modification as the material for the substrate. Of these, sapphire is preferred. The buffer layer is provided, when necessary, to adjust lattice mismatch between the substrate and the n-type semiconductor layer grown thereon.

The composition and structure of the n-type semiconductor layer may be modified to desirable ones in accordance with the prior art known to the technical field concerned. Generally, the n-type semiconductor layer comprises a contact layer acquiring good ohmic contact with the negative electrode and a cladding layer having a larger energy bandgap than the light-emitting layer. The negative electrode may be modified to have a desirable composition and structure using the prior art known to the technical field concerned.

The light-emitting layer may also have any composition and any structure known to the art without making any restrictions, such as a single quantum well (SQW) structure, multi-quantum well (MQW) structure, etc.

The p-type semiconductor layer is formed through the method of the present invention. The composition and structure thereof may be modified to desirable ones using the prior art well known to the technical field concerned. Generally, the p-type semiconductor layer comprises a contact layer acquiring hood ohmic contact with the positive electrode and a cladding layer having a larger energy bandgap than the light-emitting layer.

Te material for the positive electrode in contact with the p-type layer fabricated through the method of the present invention includes Au, Ni, Co, Cu, Pd, Pt, Rh, Os, Ir, Ru and other such metal and may further contain transparent oxides, such as ITO, NiO, CoO, etc. The transparent oxides may be contained in a film of the metal mentioned above in the form of a mass or overlapped with the metal film in a stratified form.

When using the present invention particularly in case where platinum group metal, such as Pd, Pt, Rh, Os, Ir, Ru, etc., is adopted as the material for the positive electrode, an increase in operation voltage owing to the heat generated during bonding can be prevented. Thus, a considerable effect is manifested. Of the metals, high-pure Pd, Pt and Rh are available on the market relatively with ease and can readily be used.

The material to be brought into contact with the p-type layer fabricated according to the method of the present invention may include transparent materials, such as ITO, ZnO, SnO, InO and the like. Since these transparent conductive materials exhibit better translucency in general than a thin metal film, they are materials intended for relatively positive use as a transparent electrode.

Since the conduction type of these materials is an n-type, however, no ohemic contact has heretofore been produced from contact between any of the n-type materials and a p-type GaN layer. Use of the technique of the present invention set forth in the appended claims enables ohimi contact with any of the conductive transparent materials to be materialized.

The positive electrode may be formed to cover the substantially entire surface of the contact layer or formed in a latticed or tree form. While the positive electrode thus formed may be subjected to thermal annealing for the purpose of converting it into an alloy electrode or a transparent electrode, this is not limitative.

The device may be brought to a so-called faceup (FU) mode that fetches emission from the semiconductor side using a transparent positive electrode or to a so-called flip-chip (FC) mode that fetches emission from the substrate side using a reflection type positive electrode.

The Group III-V element layer having a non-stoichiometric composition, which layer is provided in the top portion of the p-type layer located on the high-resistance region formed from the remaining hydrogen, can lower electric resistance of the top portion.

The Group III-V element layer having a non-stoichiometric composition, which layer is joined to the surface of the p-type layer, can lower contact resistance of the electrodes.

EXAMPLE 1

The present invention will next be described in detail by way of Example 1, in which a GaN semiconductor LED is fabricated from a p-type GaN semiconductor layer which contains a region in which hydrogen is intentionally caused to remain (inner portion) and a top portion including a region having a non-stoichiometric composition.

Figure 1:
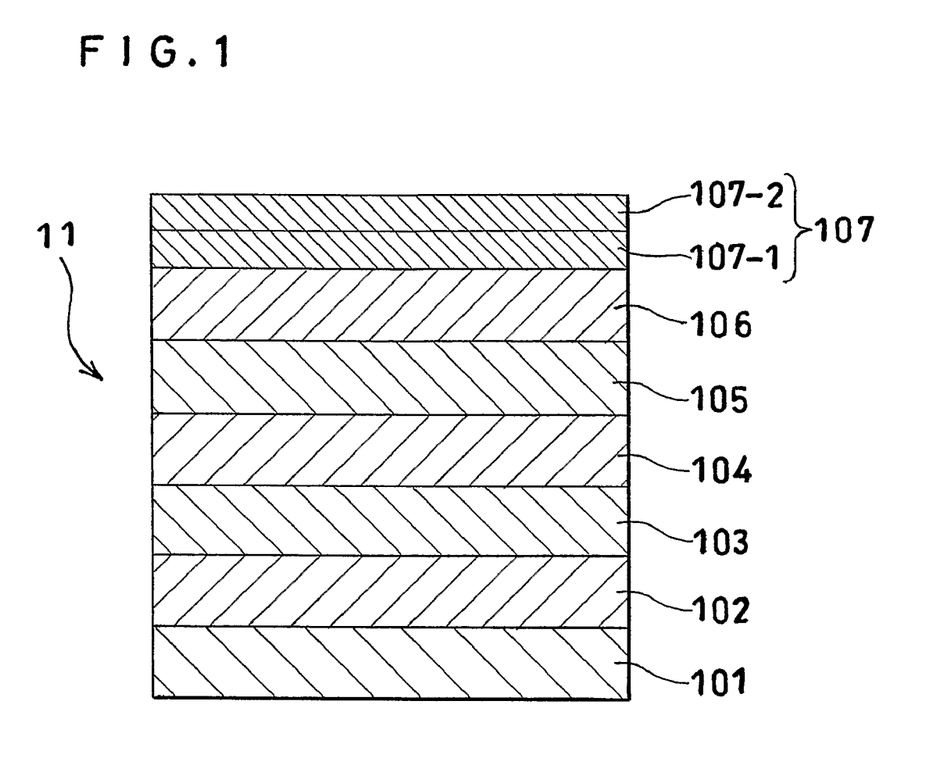
FIG. 1 is a schematic cross-sectional view showing the layer constitution of the stacked structure described in Example 1.
Figure 2:
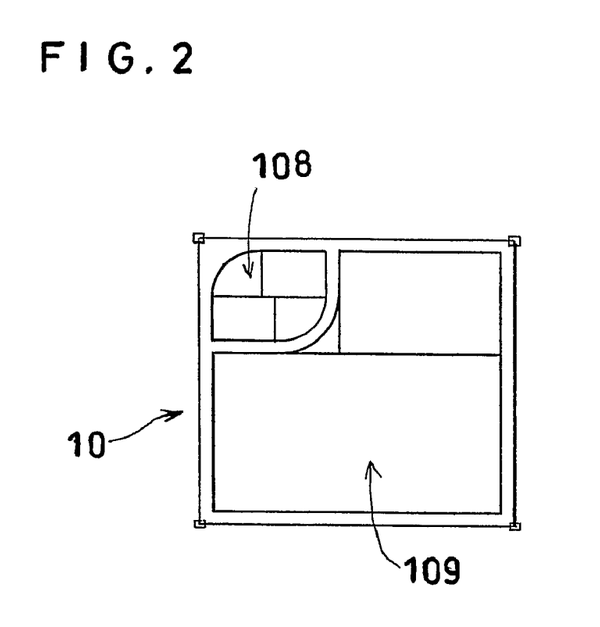
FIG. 2 is a schematic plan view of the LED described in Example 1.

FIG. 1 is a schematic cross-sectional view showing a stacked structure 11 employed for producing the LED described in Example 1. FIG. 2 is a schematic plan view of the LED 10 including the stacked structure 11 and electrodes formed thereon.

The stacked structure 11 included a substrate 101 formed of sapphire having a c-plane ((0001) crystal plane). On the c-plane, the following layers were sequentially formed: an undoped GaN layer (thickness: 2 μm) 102; a silicon (Si)-doped n-type GaN layer (thickness: 2 μm, carrier concentration: $1 \times 10^{19}$ cm$^{-3}$) 103; an Si-doped n-type $Al_{0.07}Ga_{0.93}N$ cladding layer (thickness: 12.5 nm, carrier concentration: $1 \times 10^{18}$ cm$^{-3}$) 104; a light-emitting layer 105 of a multi-quantum well structure including six Si-doped GaN barrier layers (thickness: 14.0 nm, carrier concentration: $1 \times 10^{18}$ cm$^{-3}$) and five undoped $In_{0.20}Ga_{0.80}N$ well layers (thickness: 2.5 nm); an Mg-doped p-type $Al_{0.07}Ga_{0.93}N$ cladding layer 106 (thickness: 10 nm); and an Mg-doped GaN contact layer 107 (thickness: 100 nm). These layers 102 to 107 of the stacked structure 11 were grown through conventional reduced-pressure MOCVD means.

Among them, the Mg-doped GaN contact layer 107 was grown through the procedure comprising (1) adjusting the pressure inside the growth reactor furnace after completion of the growth of the Mg-doped $Al_{0.07}Ga_{0.98}N$ cladding layer 106 to $2 \times 10^4$ Pa, (2) starting growth of an Mg-doped GaN layer from trimethylgallium (($CH_3$)$_3$Ga) and ammonia ($NH_3$) serving as sources and biscyclopentamagnesium (bis-($C_5H_5$)$_2$Mg) serving as an Mg-dopant at 1,050° C., (3) constantly supplying trimethylgallium, ammonia and the Mg-dopant to a growth reaction furnace for four minutes to grow an Mg-doped p-type GaN layer having a thickness of 80 nm was grown and during the growth, adjusting the V/III (=$NH_3$/($CH_3$)$_3$Ga) ratio to $1.9 \times 10^4$, thereby forming the inner portion 107-1, (4) drastically reducing the flow rate of ammonia while maintaining the supply of trimethylgallium constant to thereby control the V/III ratio to $9 \times 10^3$, and continuing the growth for 30 seconds to gorw a Ga-rich GaN layer having a non-stoichiometric composition serving as the top portion 107-2 and (5) stopping supply of trimethylgallium and bis-($C_5H_5$)$_2$Mg to the growth reactor furnace to thereby terminate the growth of the Mg-doped p-type GaN layer.

Immediately after completion of vapor-phase growth of the Mg-doped p-type GaN layer 107, operation of a high-frequency induction heater that had been employed for heating the substrate 101 was stopped. Cooling of the stacked structure 11 including the vapor-phase-grown component layers 102 to 107 was then started from 1,050° C. in the growth reactor furnace. During cooling of the stacked structure 11, the employed atmosphere contained nitrogen and the hydrogen carrier gas employed for growing the component layers of the stacked structure 11 at a ratio by volume of 95:5. In the atmosphere, the substrate was cooled from 1,050° C. to room temperature at an average cooling rate of 50° C./min.

After cooling to room temperature, the stacked structure 11 was removed from the growth reactor furnace, and the magnesium atom concentration and the hydrogen atom concentration of the Mg-doped GaN layer 107 were quantitatively determined through conventional SIMS. The Mg atom concentration was found to be $7 \times 10^{19}$ cm$^{-3}$, and the concentration was virtually uniform from the top to the bottom in the depth direction. The hydrogen atom concentration of the top portion was slightly lowered. However, the hydrogen atom concentration of the inner portion, which is located beneath the portion from the top surface to the 30 nm-depth, was found to be $6 \times 10^{19}$ cm$^{-3}$ and almost uniformly distributed. Thus, in the inner portion, substantially all Mg atoms were electrically inactivated by hydrogen atoms, resulting in high resistance. On the surface of the top portion of the Mg-doped GaN layer 107, Ga was deposited. The element ratio of Ga (including deposited Ga) to N was greater than 1 (i.e., Ga-rich). Contact resistance between the surface and an electrode could be lowered by virtue of Ga element deposited on the surface.

The LED 10 was fabricated from the stacked structure 11 having the Mg-doped p-type GaN layer 107. Firstly, the region of the structure where an n-type ohmic electrode 108 was to be formed was dry-etched in a typical manner, whereby the above region of the Si-doped GaN layer 103 was exposed. On the exposed surface, the n-type ohmic electrode 108 (of a double layer structure of titanium (Ti) and aluminum (Al)) was formed. Other than the n-type ohmic electrode area, a p-type ohmic electrode 109 was formed on virtually entire surface of the Mg-doped p-type GaN layer 107 including a top portion having a Ga-rich non-stoichiometric composition. The p-type ohmic electrode 109 had a multilayer structure of platinum (Pt) film, rhodium (Rh) film and gold (Au) film and a function of reflecting light emitted from the light-emitting layer to the sapphire substrate 101. The Pt film was in contact with the surface of the Mg-doped p-type GaN layer 107.

After formation of the p-type and the n-type ohmic electrodes 108 and 109, the backside of the sapphire substrate 101 was ground by use of abrasive grains, such as diamond particles, to thereby reduce the thickness of the substrate 101 from about 350 µm to about 85 µm. The surface further underwent precision polishing to thereby form a mirror-finished surface. Then, the stacked structure 11 was cut into square (350 µm×350 µm) LED 10 pieces. Each chip was sub-mounted via the ohmic electrodes 108 and 109, thereby forming a flip-chip piece. The piece was placed on a lead frame and wire-bonded to the lead frame with gold (Au) wire.

Electric characteristics and emission characteristics of the flip-chip LEDs were evaluated when forward current was caused to flow between the p-type ohmic electrode 108 and the n-type ohmic electrode 109. The forward voltage (Vf) at a forward current of 20 mA was found to be 3.1 V. The light emitted through the sapphire substrate 101 to the outside had a wavelength of 455 nm. The output of the emitted light, as determined through a typical integrating sphere, was 10 mW. These characteristics were attained with uniformity from LED to LED among about 10,000 LEDs (products with defective appearance were not included as such had been rejected in advance) formed on virtually the entirety of the circular substrate 101 (diameter: 2 inches).

Each LED 10 was subjected to a simple electrostatic breakdown test. Pulse voltage was instantaneously applied to the electrodes for simulating instantaneous application of static electricity to the LED, and occurrence of short between the electrodes in the reverse direction was investigated. As a result, among 100 test chips, only one LED chip was broken upon application of pulse voltage of 1,000 V. That is, percent failure with respect to reverse voltage (Vr) was 1%.

EXAMPLE 2

The present invention will next be described in detail by way of Example 2, in which a material having a non-stoichiometric composition was caused to be jointed to the surface of the same stacked structure as described in Example 1, thereby fabricating an LED.

Figure 3:
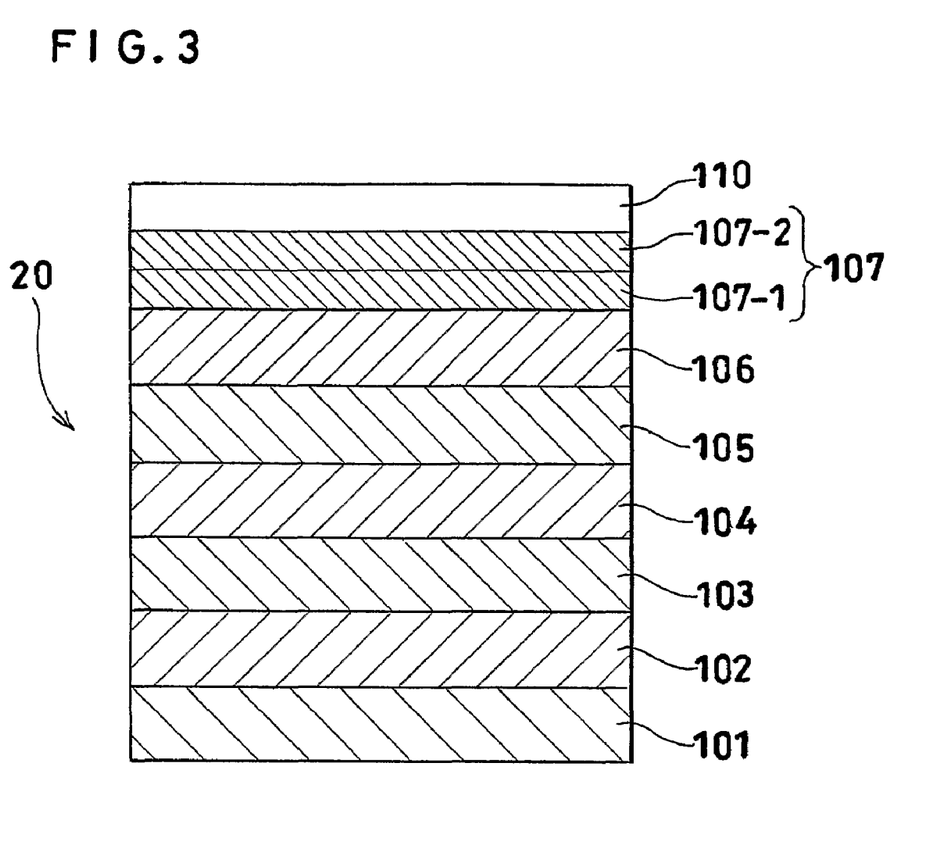
FIG. 3 is a schematic cross-sectional view showing the stacked structure described in Example 2.

FIG. 3 is a schematic cross-sectional view of an LED 20 described in Example 2. In FIG. 3, the same members as employed in FIGS. 1 and 2 are represented by the same reference numerals, and detailed description thereof was omitted.

Immediately after completion of vapor phase growth of the Mg-doped p-type GaN layer 107, operation of a high-frequency induction heater that had been employed for heating the substrate 101 was stopped. Cooling of the stacked structure 11 including the vapor-phase-grown component layers 102 to 107 was then started from 1,050° C. in the growth reactor furnace. During cooling of the stacked structure 11, the employed atmosphere contained nitrogen and the hydrogen carrier gas employed for growing the component layers of the stacked structure 11 at a ratio by volume of 9:1. The stacked structure was cooled from 1,050° C. to 850° C. at a cooling rate of 120° C./min.

While the stacked structure 11 was maintained at 850° C., an undoped boron phosphide (BP) layer 110 was vapor-phase-grown on the surface of the Mg-doped p-type GaN layer 107 through typical atmospheric pressure (near atmospheric pressure) MOCVD means. The boron phosphide layer 110 was grown from triethylborane $((C_2H_5)_3B)$ and phosphine $(PH_3)$ as sources. During the growth, the V/III ratio $(=PH_3/(C_2H_5)_3B$ ratio) was adjusted to 10 so as to form the boron (B)-rich boron phosphide layer 110. The thus formed undoped boron phosphide layer 110 exhibited p-type conduction, and was found to have, at room temperature, a carrier (hole) concentration of $1 \times 10^{19}$ cm$^{-3}$ and a resistivity of $5 \times 10^{-2}$ Ω·cm, indicating that the layer had exhibited low electric resistance. Deviation in composition of the boron phosphide layer 110 from the stoichometry was about 0.5%, as estimated on the basis of difference in lattice constant. The thinkness of the undoped boron phosphide layer 110 having a non-stoichiometric composition was controlled to 0.1 µm.

Through SIMS analysis, the hydrogen atom concentration of a portion from the top surface of the Mg-doped p-type GaN layer 107 to 15 nm-depth was found to be $3 \times 10^{19}$ cm$^{-3}$ and of a portion deeper than the 15 nm-depth was found to be $6 \times 10^{19}$ cm$^{-3}$. The hydrogen atom concentration was almost uniformly distributed in both portions. The magnesium atom concentration was found to be $7 \times 10^{19}$ cm$^{-3}$, and the concentration was virtually uniform from the surface of the layer 107 to the bottom in the depth direction. The results indicate that a high-resistance region having an atomic concentration ratio of Mg to hydrogen of about 1:1 is formed in the inner portion of the Mg-doped p-type GaN layer 107 from the junction interface between the layers 106 and 107 to 85 nm-depth. The resistivity of the high-resistance region included in the Mg-doped p-type GaN layer 107 was estimated to be about 10 Ω·cm from the current-voltage (I-V) characteristics.

Similarly to Example 1, an n-type ohmic electrode 108 was provided on the n-type GaN layer 103, and a p-type ohmic electrode 109 was provided on the undoped boron phosphide layer having a non-stoichiometric composition to thereby fabricate a stacked structure 20 having a cross-section shown in FIG. 3. Electric characteristics and emission characteristics of the stacked structure 20 mounted in a flip-chip manner were evaluated when forward current was caused to flow between the n-type ohmic electrode 108 and the p-type ohmic electrode 109. The forward voltage (Vf) at a forward current of 20 mA was found to be 3.0 V, which was lower than that of the LED chip 10 of Example 1. The light emitted through the sapphire substrate 101 to the outside had a wavelength of 455 nm. The output of the emitted light, as determined through a typical integrating sphere, was 12 mW. These characteristics were attained with uniformity from LED to LED among about 10,000 LEDs (products with defective appearance were not included as such had been rejected in advance) formed on virtually the entirety of the circular substrate 101 (diameter: 2 inches).

Each stacked structure 20 was subjected to a simple electrostatic breakdown test. Pulse voltage was instantaneously applied to the electrodes for simulating instantaneous application of static electricity to the LED, and occurrence of short between the electrodes in the reverse direction was investigated. As a result, among 100 test chips, only one LED chip was broken upon application of pulse voltage of 1,000 V. That is, percent failure with respect to reverse voltage (Vr) was 1%.

EXAMPLE 3

In Example 3 in addition to the procedure in Example 1, immediately after completion of the vapor phase growth of the contact layer 107 of Mg-doped AlGaN, the carrier gas was changed from hydrogen to nitrogen, and the flow rate of ammonium was decreased while the flow rate of nitrogen was increased by the ammonium decrement. To be specific, the amount of ammonium occupying 50% in volume the entire amount of the gases supplied during the growth was lowered to 2% at that time. Simultaneously therewith, operation of a high-frequency induction heater that had been used for heating the substrate 101 was stopped.

Furthermore, two minutes after maintaining that state, the supply of ammonium was stopped. The substrate temperature at that time was 850° C.

After cooling to room temperature, the stacked structure 11 was removed from the growth reactor furnace, and the magnesium atom concentration and the hydrogen atom concentration of the Mg-doped GaN layer 107 were quantitatively determined through conventional SIMS. The Mg atom concentration was found to be $7 \times 10^{19}$ cm$^{-3}$, and the concentration was virtually uniform from the top to the bottom in the depth direction. The hydrogen atom concentration of the top portion was slightly lowered. However, the hydrogen atom concentration of the inner portion, which is located beneath the portion from the top surface to 20 nm-depth, was found to be $6 \times 10^{19}$ cm$^{-3}$ and almost uniformly distributed. Thus, in the inner portion, substantially all Mg atoms were electrically inactivated by hydrogen atoms, resulting in high resistance. Since the portion from the top surface of the Mg-doped GaN layer 107 to 30 nm-depth or less was formed with the extremely low III/V ratio, the layer because a low-resistance layer exhibiting resistivity of about 0.5 Ω·cm at room temperature.

The LED 10 was fabricated from the stacked structure 11 having the Mg-doped p-type GaN layer 107. Firstly, the region of the structure where an n-type ohmic electrode 108 was to be formed was dry-etched in a typical manner, whereby the above region of the Si-doped GaN layer 103 was exposed. On the exposed surface, the n-type ohmic electrode 108 (of a double layer structure of titanium (Ti) and aluminum (Al)) was formed. Other than the n-type ohmic electrode area, a p-type ohmic electrode 109 was formed on virtually entire surface of the Mg-doped p-type GaN layer 107 including a top portion having a Ga-rich non-stoichiometric composition. The p-type ohmic electrode 109 had a multilayer structure of platinum (Pt) film, rhodium (Rh) film and gold (Au) film and a function of reflecting light emitted from the light-emitting layer to the sapphire substrate 101. The Pt film was in contact with the surface of the Mg-doped p-type GaN layer 107.

After formation of the p-type and the n-type ohmic electrodes 108 and 109, the backside of the sapphire substrate 101 was ground by use of abrasive grains, such as diamond particles, to thereby reduce the thickness of the substrate 101 from about 350 μm to about 85 μm. The surface further underwent precision polishing to thereby form a mirror-finished surface. Then, the stacked structure 11 was cut into square (350 μm×350 μm) LED 10 pieces. Each chip was sub-mounted via the ohmic electrodes 108 and 109, thereby forming a flip-chip piece. The piece was placed on a lead frame and wire-bonded to the lead frame with gold (Au) wire.

Electric characteristics and emission characteristics of the flip-chip LEDs were evaluated when forward current was caused to flow between the p-type ohmic electrode 108 and the n-type ohmic electrode 109. The forward voltage (Vf) at a forward current of 20 mA was found to be 3.1 V. The light emitted through the sapphire substrate 101 to the outside had a wavelength of 455 nm. The output of the emitted light, as determined through a typical integrating sphere, was 10 mW. These characteristics were attained with uniformity from LED to LED among about 10,000 LEDs (products with defective appearance were not included as such had been rejected in advance) formed on virtually the entirety of the circular substrate 101 (diameter: 2 inches).

Each LED 10 was subjected to a simple electrostatic breakdown test. Pulse voltage was instantaneously applied to the electrodes for simulating instantaneous application of static electricity to the LED, and occurrence of short between the electrodes in the reverse direction was investigated. As a result, among 100 test chips, only one LED chip was broken upon application of pulse voltage of 1,000 V. That is, percent failure with respect to reverse voltage (Vr) was 1%.

INDUSTRIAL APPLICABILITY

The semiconductor device of the present invention is employed in devices, such as a light-emitting diode, a laser diode or a pin-type photodetector.

The invention claimed is:

1. A gallium nitride-based semiconductor device having a p-type layer that is a gallium nitride (GaN) compound semiconductor layer containing a p-type impurity and exhibiting p-type conduction, wherein the p-type layer comprises a top portion and an inner portion located under the top portion, wherein the inner portion contains the p-type impurity and, in combination therewith, hydrogen, wherein the inner portion has a hydrogen concentration of $1 \times 10^{18}$ cm$^{-3}$ or more and an impurity concentration of $1 \times 10^{18}$ cm$^{-3}$ to $1 \times 10^{21}$ cm$^{-3}$ and wherein the top portion includes a region containing a Group III element and a Group V element at a non-stoichiometric atomic ratio, and wherein the top portion has a hydrogen concentration lower than that of the inner portion.

2. A gallium nitride-based semiconductor device according to claim 1, wherein the inner portion of the p-type layer has a percent thickness of 40% to 99.9% with respect to a thickness of the p-type layer.

3. A gallium nitride-based semiconductor device according to claim 1, wherein the inner portion has a hydrogen concentration that is equal to, or lower than, an impurity concentration.

4. A gallium nitride-based semiconductor device according to claim 1, wherein the region containing a Group III element and a Group V element at a non-stoichiometric atomic ratio has a thickness of 1 to 10 nm from the top surface of the p-type layer in a depth direction.

5. A gallium nitride-based semiconductor device according to claim 1, wherein the top portion of the p-type layer has a surface having Ga deposited thereon.

6. A gallium nitride-based semiconductor device according to claim 1, wherein the p-type layer has a surface having joined thereto a gallium nitride semiconductor material containing a Group III element and a Group V element at a non-stoichiometric atomic ratio.

7. A gallium nitride-based semiconductor device according to claim 6, wherein the gallium nitride semiconductor material is boron phosphide (BP) having a non-stoichiometric atomic ratio.

* * * * *